United States Patent
Lee et al.

(10) Patent No.: US 9,437,444 B2
(45) Date of Patent: Sep. 6, 2016

(54) SEMICONDUCTOR DEVICE HAVING HARD MASK STRUCTURE AND FINE PATTERN AND FORMING METHOD THEREOF

(71) Applicant: SK hynix Inc., Icheon-si (KR)

(72) Inventors: Sung-Kwon Lee, Icheon (KR); Jun-Hyeub Sun, Icheon (KR); Ho-Jin Jung, Icheon (KR); Chun-Hee Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/062,563

(22) Filed: Oct. 24, 2013

(65) Prior Publication Data

US 2014/0322915 A1     Oct. 30, 2014

(30) Foreign Application Priority Data

Apr. 30, 2013   (KR) .................. 10-2013-0048544

(51) Int. Cl.
| | | |
|---|---|---|
| H01L 21/311 | (2006.01) | |
| H01L 21/308 | (2006.01) | |
| H01L 21/033 | (2006.01) | |

(52) U.S. Cl.
CPC ....... *H01L 21/3086* (2013.01); *H01L 21/0337* (2013.01)

(58) Field of Classification Search
CPC .................................................... H01L 21/308
USPC ............................................................ 438/701
See application file for complete search history.

(56) References Cited

U.S. PATENT DOCUMENTS

| | | | |
|---|---|---|---|
| 8,043,915 B2 | 10/2011 | Tran | |
| 8,241,838 B2 | 8/2012 | Yoshino | |
| 2005/0020011 A1* | 1/2005 | Nakajima | B82Y 10/00 438/257 |
| 2006/0043379 A1* | 3/2006 | Zhang | H01L 29/8128 257/77 |
| 2008/0131793 A1* | 6/2008 | Lee et al. | 430/5 |
| 2008/0283957 A1* | 11/2008 | Kang | H01L 21/76897 257/499 |
| 2010/0130011 A1 | 5/2010 | Endoh et al. | |
| 2010/0237407 A1* | 9/2010 | Nojima | 257/329 |
| 2010/0295110 A1* | 11/2010 | Takaishi | H01L 28/91 257/300 |
| 2010/0317194 A1* | 12/2010 | Su | G03F 7/0035 438/694 |
| 2012/0040528 A1* | 2/2012 | Kim | H01L 21/76816 438/675 |
| 2012/0135601 A1* | 5/2012 | Park | H01L 21/0337 438/675 |
| 2013/0260562 A1* | 10/2013 | Park et al. | 438/702 |
| 2014/0106528 A1* | 4/2014 | Quyang | H01L 21/8234 438/275 |
| 2015/0311113 A1* | 10/2015 | Zhang | H01L 21/76802 257/773 |

FOREIGN PATENT DOCUMENTS

| | | |
|---|---|---|
| KR | 10-2012-0004217 A | 1/2012 |
| KR | 10-2012-0021722 A | 3/2012 |
| KR | 10-2013-0006738 A | 1/2013 |

* cited by examiner

*Primary Examiner* — Matthew Landau
*Assistant Examiner* — Igwe U Anya

(57) ABSTRACT

A method for fabricating a semiconductor device includes forming a plurality of first hard mask patterns separated by a plurality of trenches on a target layer, forming a plurality of second hard mask patterns filling the plurality of trenches, forming a plurality of first opening units in the plurality of second hard mask patterns, forming a plurality of second opening units in the plurality of first hard mask patterns and forming a plurality of patterns using the plurality of first opening units and the plurality of second opening units, which are transferred by etching the target layer.

16 Claims, 25 Drawing Sheets

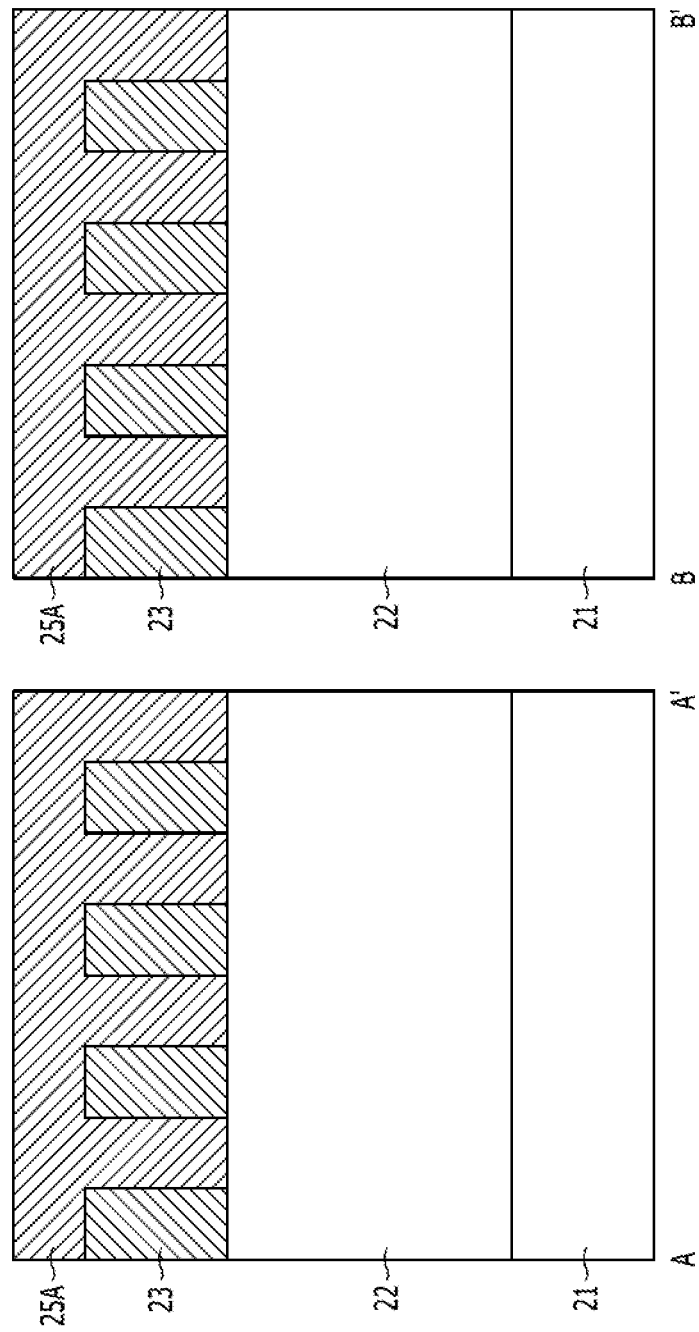

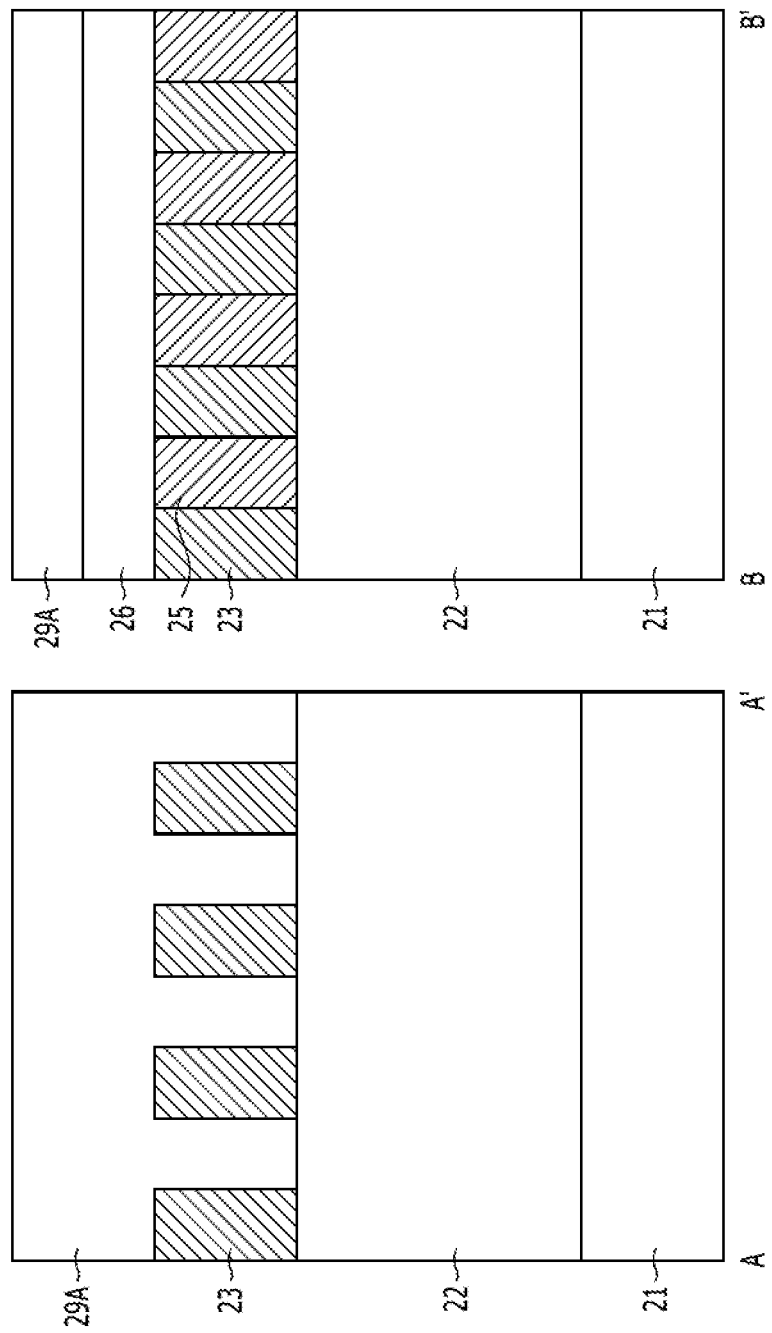

SEMICONDUCTOR DEVICE HAVING HARD MASK STRUCTURE AND FINE PATTERN AND FORMING METHOD THEREOF

CROSS-REFERENCE TO RELATED APPLICATIONS

The present application claims priority of Korean Patent Application No. 10-2013-0048544, filed on Apr. 30, 2013, which is incorporated herein by reference in its entirety.

BACKGROUND

1. Field

Embodiments of the present invention relate to a method for fabricating a semiconductor device, and more particularly, to a semiconductor device having a hard mask structure and a method for forming a pattern including a plurality of holes.

2. Description of the Related Art

As the degree of integration of semiconductor devices is increased, the design rule for components of the semiconductor device has been reduced. A pattern of the semiconductor device becomes more fine as the degree of integration of the semiconductor device increases. As a result, implementation of fine patterns having a fine width and interval has become increasingly important.

SUMMARY

An embodiment of the present invention is directed to a hard mask structure for forming a fine pattern and a method for fabricating a fine pattern of a semiconductor device using the same.

In accordance with an embodiment of the present invention, a method for fabricating a semiconductor device includes forming a plurality of first hard mask patterns separated by a plurality of trenches on a target layer, forming a plurality of second hard mask patterns gap-filling the plurality of trenches, forming a plurality of first opening units in the plurality of second hard mask patterns, forming a plurality of second opening units in the plurality of first hard mask patterns and forming a plurality of patterns corresponding to the plurality of first opening units and the plurality of second opening units by etching corresponding portions of the target layer.

In accordance with an embodiment of the present invention, a method for fabricating a semiconductor device includes forming a plurality of first hard mask patterns separated by a plurality of trenches on a target layer, the plurality of first hard mask patterns and the plurality of trenches extending in a first direction, forming a plurality of second hard mask patterns by gap-filling the plurality of trenches, forming a plurality of first sacrificial patterns extending in a second direction that crosses the first direction, forming a plurality of first opening units by etching the plurality of second hard mask patterns using the plurality of first sacrificial patterns and the plurality of first hard mask patterns as an etch mask, forming a plurality of second sacrificial patterns by filling between the plurality of first opening units and filling spaces between each of the plurality of first sacrificial patterns, forming a plurality of second opening units by etching the plurality of first hard mask patterns and the plurality of first sacrificial patterns using the plurality of second sacrificial patterns and the plurality of second hard mask patterns as an etch mask, removing the plurality of second sacrificial patterns, and forming a plurality of hole patterns by etching the target layer under the plurality of first opening units and the plurality of second opening units.

In accordance with an embodiment of the present invention, a semiconductor device includes a target layer, and a hybrid hard mask structure including a first hard mask pattern having a plurality of first opening units and a second hard mask pattern having a plurality of second opening units, wherein the first hard mask pattern and the second hard mask pattern are alternately formed at a same level, and wherein a plurality of hole patterns are formed on the target layer by transferring a pattern of the plurality of first opening units and the plurality of second opening units.

The first hard mask pattern includes silicon oxide.

The second hard mask pattern includes polysilicon.

The plurality of first opening units and the plurality of second opening units form a zigzag pattern.

The plurality of first opening units and the plurality of second opening units have a tapered profile.

Each of the plurality of first opening units and the plurality of second opening units includes a hole having an elliptical shape or a polygon shape, and each of the plurality of hole patterns includes a hole having a circle shape.

In accordance with an embodiment of the present invention, a semiconductor device having a mask pattern for patterning a plurality of holes on a target layer, the semiconductor device includes a first hard mask pattern extending in predetermined direction, and having first separation units provided between a plurality of first opening units, and a second hard mask pattern extending in a same direction with the first hard mask pattern, having second separation units provided between a plurality of second opening units, wherein the first hard mask pattern and the second hard mask pattern are alternately arrayed, the plurality of first opening units are adjacent to the second separation units, and the plurality of second opening units are adjacent to the first separation units.

The plurality of first opening units and the plurality of second opening units are arranged in a zigzag pattern.

BRIEF DESCRIPTION OF THE DRAWINGS

FIGS. 3A to 3L are cross-sectional views along A-A' and B-B' lines shown in FIGS. 2A to 2L, respectively.

DETAILED DESCRIPTION

Figure 1A:
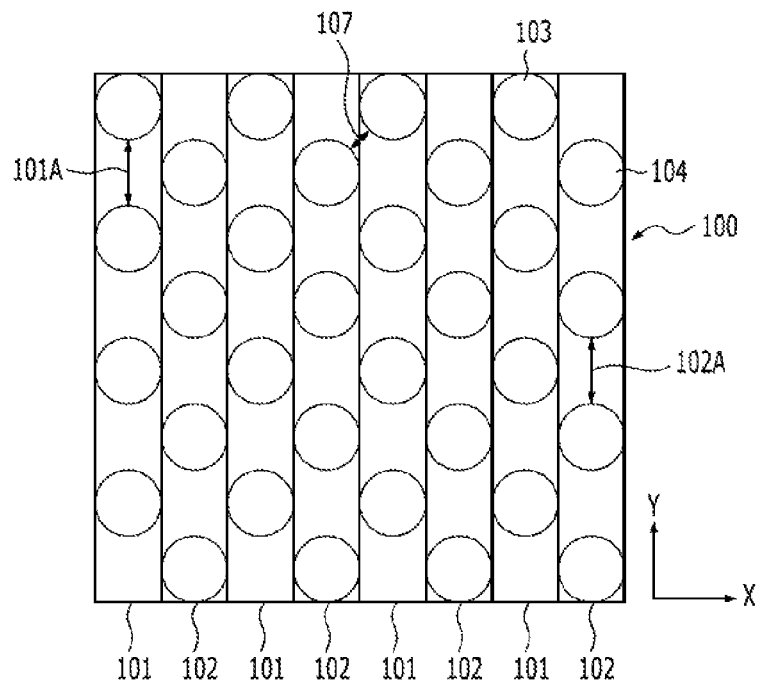
FIG. 1A is a diagram illustrating a hybrid hard mask structure in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1A is a diagram illustrating a hybrid hard mask structure in accordance with an embodiment of the present invention.

Figure 1B:
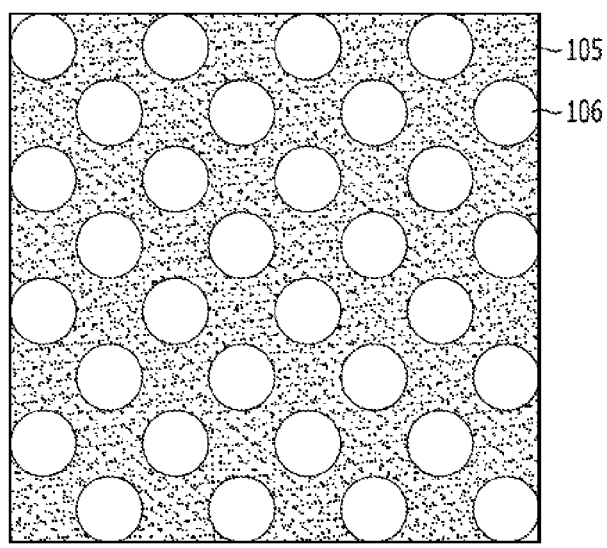
FIG. 1B is a diagram illustrating patterns formed by a hybrid hard mask structure.

FIG. 1B is a diagram illustrating patterns formed by a hybrid hard mask structure.

Referring to FIG. 1A, a hybrid hard mask structure 100 includes first hard mask patterns 101 and second hard mask patterns 102. The first hard mask patterns 101 and the second hard mask patterns 102 are formed at the same level. In an embodiment, the first hard mask patterns 101 and the second hard mask patterns 102 alternate in a first direction, e.g., in a direction along the X axis of FIG. 1A).

The first hard mask patterns 101 and the second hard mask patterns 102 are line and space patterns having line type patterns which are separated by spaces. The second hard mask patterns 102 may be alternately formed between the first hard mask patterns 101. The first hard mask patterns 101 and the second hard mask patterns 102 are line type patterns that extend in a second direction, e.g., a direction along the Y axis of FIG. 1A.

The first hard mask patterns 101 and the second hard mask patterns 102 may include materials having different etching selectivity from each other. The first hard mask patterns 101 and the second hard mask patterns 102 may include a silicon oxide or a polysilicon. For example, in an embodiment, the first hard mask patterns 101 include silicon oxide and the second hard mask patterns 102 include polysilicon. In another embodiment, the first hard mask patterns 101 may include polysilicon and the second hard mask patterns 102 may include silicon oxide. A plurality of first opening units 103 may be formed in the first hard mask patterns 101. A plurality of second opening units 104 may be formed in the second hard mask patterns 102. A size of the plurality of first opening units 103 may be identical to or different from a size of the plurality of second opening units 104. The plurality of first opening units 103 and the plurality of second opening units 104 may not be aligned over the same axis. For example, viewing FIG. 1A from left to right along the X-axis, the first opening units 103 are not aligned with the second opening units 104. That is, the plurality of first opening units 103 and the plurality of second opening units 104 are arrayed in a zigzag pattern.

The plurality of first opening units 103 may include hole patterns having a width or diameter that is less than or equal to a line width of the first hard mask patterns 101. The plurality of second opening units 104 may include hole patterns having a width or diameter that is less than or equal to the line width of the second hard mask patterns 102. The plurality of first opening units 103 and the plurality of second opening units 104 may include hole patterns having various shapes, such as circle-shaped hole patterns, diamond-shaped hole patterns, square-shaped hole patterns, polygon-shaped hole patterns, or a combination thereof.

The plurality of first opening units 103 included in the first hard mask patterns 101 may be separated by first separation units 101A. The plurality of second opening units 104 included in the second hard mask patterns 102 may be separated by second separation units 102A. Thus, along the first direction (e.g., the X direction), the plurality of second opening units 104 may be formed between the first separation units 101A and the plurality of first opening units 103 may be formed between the second separation units 102A. The first separation units 101A and the second separation units 102A serve as separation structures having a predetermined width. For example, the first separation units 101A may have a width that is equal to or greater than a width or diameter of the second opening units 104, and the second separation units 102A may have a width that is equal to or greater than a width or diameter of the first opening units 103.

In an embodiment, an interval 107 between each of the plurality of first opening units 103 and each of the plurality of second opening units 104 is narrower than a width of the first separation units 101A provided between neighboring first opening units 103, and narrower than a width of the second separation units 102A provided between neighboring second opening units 104. Because the first opening units 103 in the first hard mask pattern 101 are aligned with the second separation units 102A in the second hard mask pattern 102 in the X direction, and the second separation units 102A have a predetermined width in the Y direction, an interval 107 is formed between neighboring first opening units 103 and second opening units 104. In other words, the predetermined spacing between opening units in alternating hard mask patterns results in a consistent and relatively fine spacing between opening units in adjacent hard mask patterns without forming additional spacing structures.

As shown in FIG. 1B, patterns 106 formed in a target layer 105 may be highly integrated using the hybrid hard mask structure 100 as an etching mask. The patterns 106 may be formed in the target layer 105 by transferring a pattern of the plurality of first opening units 103 and the plurality of second opening units 104 to the target layer 105. That is, the patterns 106 corresponding to the plurality of first opening units 103 and the plurality of second opening units 104 of the hybrid hard mask structure 100 are formed in the target layer 105 by etching corresponding portions of the target layer. The patterns 106 may include circle-shaped hole patterns and may be arrayed in a zigzag pattern.

As described above, a pattern of holes with uniform dimensions may be formed without a bridge between adjacent holes through the hybrid hard mask structure 100 according to an embodiment of the present invention.

FIGS. 2A to 2L are plan views illustrating a patterning method of a semiconductor device in accordance with embodiments of the present invention. FIGS. 3A to 3L are cross-sectional views along A-A' and B-B' lines of FIGS. 2A to 2L, respectively.

Figure 2A:
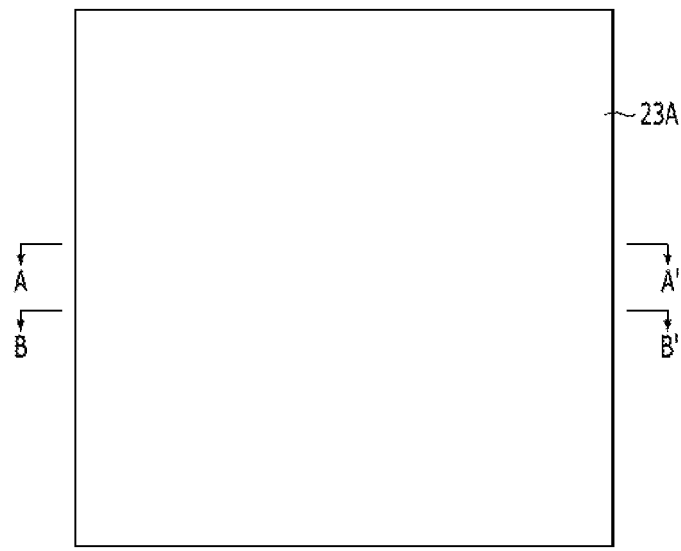
FIGS. 2A to 2L are plan views illustrating a patterning method of a semiconductor device in accordance with embodiments of the present invention.
Figure 3A:
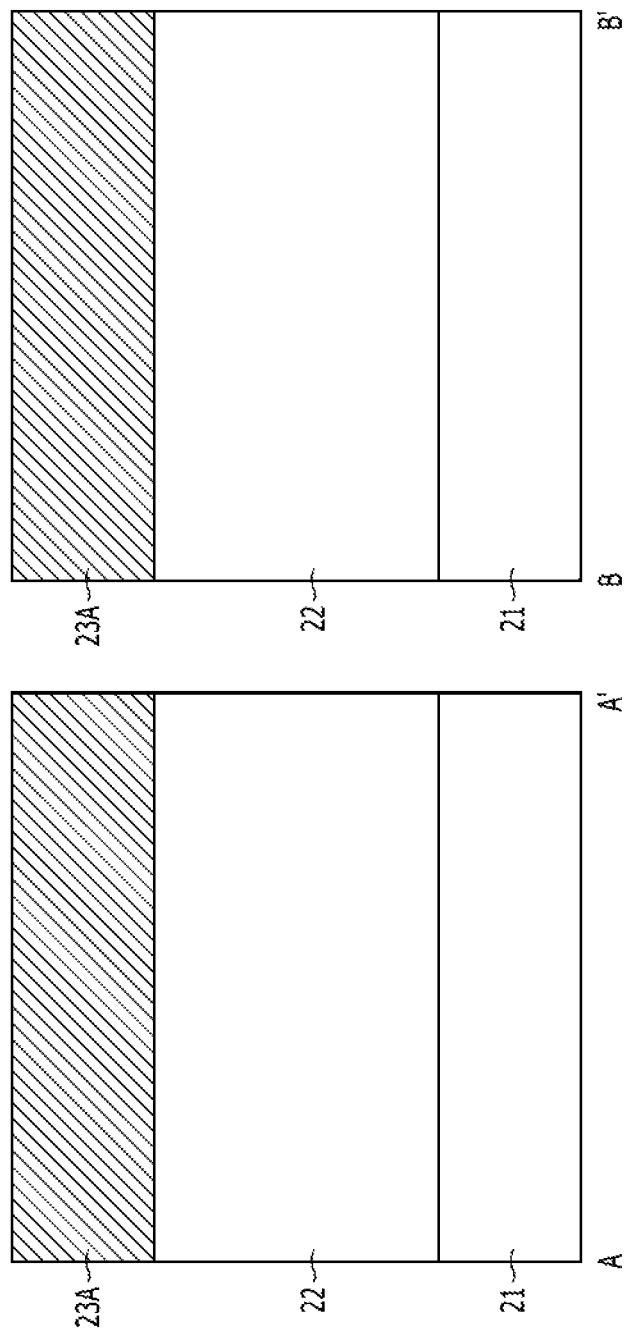

Referring to FIGS. 2A and 3A, a target layer 22 is formed on a substrate 21. The substrate 21 may include a semiconductor material. For example, the substrate 21 may include a silicon substrate, a silicon germanium substrate or a silicon-on-insulator (SOI) substrate. The substrate 21 may be provided with a bulk wafer or an epitaxial layer. The target layer 22 may be formed of various materials according to the function of a pattern to be formed.

In an embodiment, if a gate electrode is to be formed on the substrate 21, the target layer 22 may include a conductive layer. For example, the target layer 22 may include a metal-containing layer, a doped polysilicon or a stacked structure of the metal-containing layer and the doped polysilicon. If a bit line is formed on the substrate 21, the target layer 22 may include a conductive metal nitride or a metal such as a tungsten or an aluminum. If a contact hole is to be formed on the substrate 21, the target layer 22 may include an insulating material such as a silicon oxide or a silicon nitride.

In an embodiment, if a fine pattern is formed by etching the substrate 21, the target layer 22 may be omitted. For example, if a method in accordance with an embodiment of the present invention is used in order to define an active region on the substrate 21, the target layer 22 may be omitted.

The first hard mask layer 23A is formed on the target layer 22. The first hard mask layer 23A is used as a mask for forming a pattern on the target layer 22. The first hard mask layer 23A may include a silicon oxide. The first hard mask layer 23A may be formed of a material having a different etch selectivity according to a material of the target layer 22.

Figure 2B:
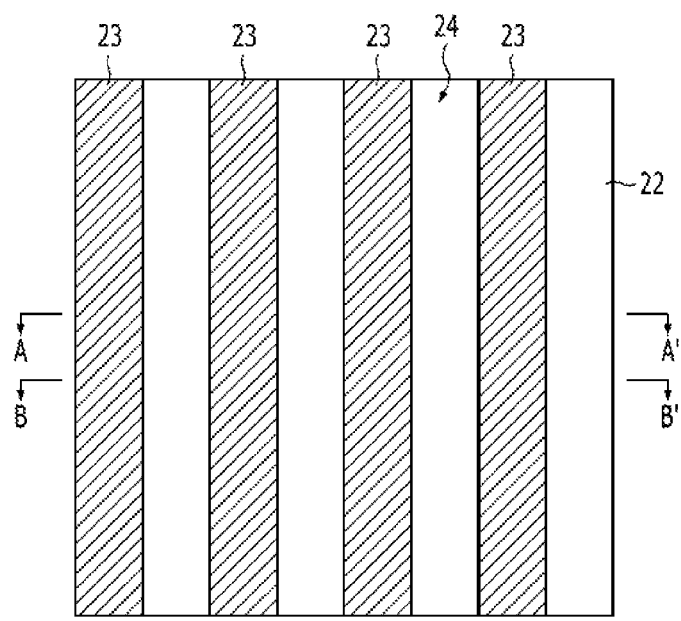
Figure 3B:
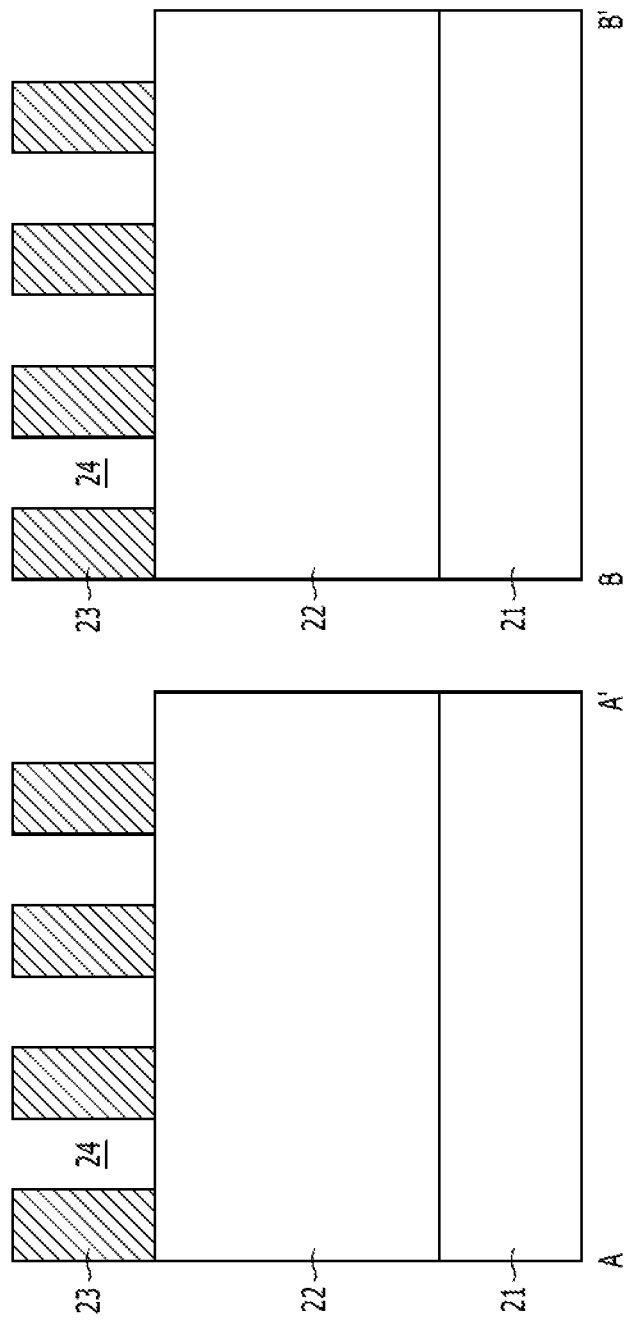

Referring to FIGS. 2B and 3B, the first hard mask patterns 23 may be formed by etching the first hard mask layer 23A. The first hard mask patterns 23 may be line patterns extending toward a first direction. A first space 24 is formed between the line patterns and is also formed along the first direction. The first space 24 may be trench.

A spacer patterning technology (SPT) process may be applied to form the first hard mask patterns 23. In an embodiment, the SPT process may include a positive SPT process. A positive SPT process is an etch process that uses a spacer as an etch mask. A photoresist pattern, including a line type pattern, is formed on the first hard mask layer 23A, and spacer is formed on a sidewall of the photoresist pattern. After removing the photoresist pattern, the first mask layer 23A is etched using the spacer as the etch mask. Thus, the first hard mask patterns 23 and the first spaces 24 are formed.

Figure 2C:
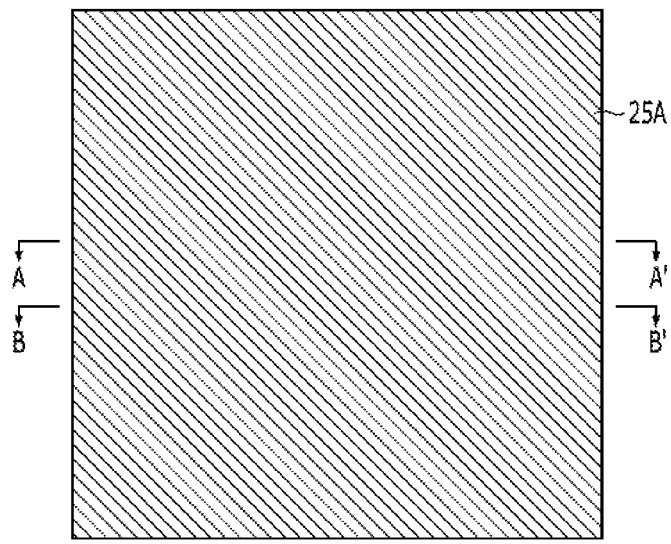

Referring to FIGS. 2C and 3C, the second hard mask layer 25A filling the first spaces 24 between the first hard mask patterns 23 is formed. The second hard mask layer 25A may include a polysilicon. The second hard mask layer 25A may be formed of a material having a different etch selectivity according to a material of the target layer 22.

Figure 2D:
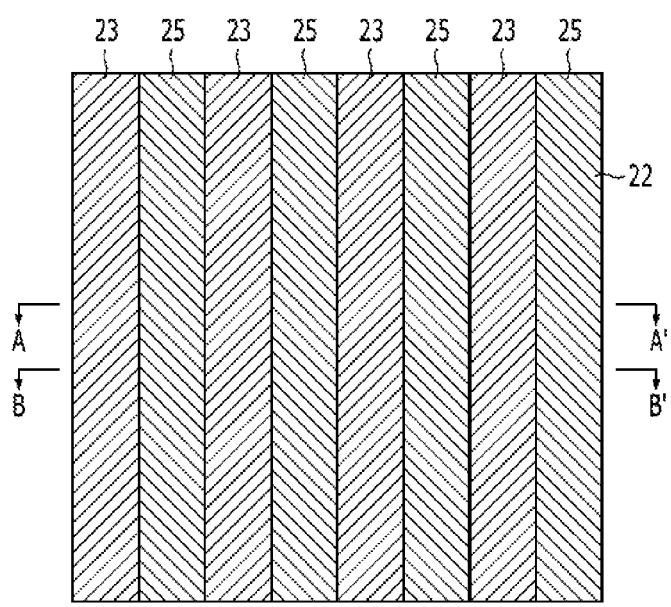
Figure 3D:
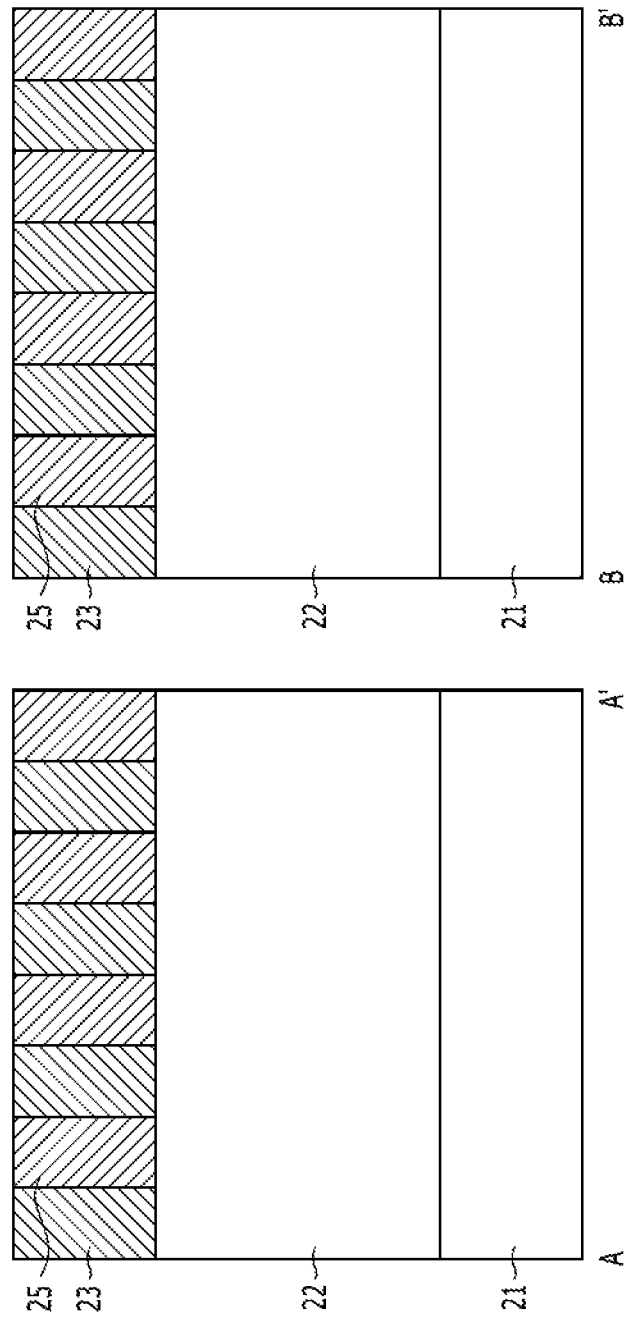

As shown in FIGS. 2D and 3D, the second hard mask patterns 25 are formed by removing a portion of the second hard mask layer 25A from an upper surface of the first hard mask patterns 23. In embodiments, the portion of the second hard mask layer 25A is removed by a planarization process or an etching process. Thus, the second hard mask patterns 25 are formed as line type patterns extending in a first direction by filling the first spaces 24.

By forming the second hard mask patterns 25 in such a manner, the first hard mask patterns 23 and the second hard mask patterns 25 are alternately formed on the target layer 22. Furthermore, the first hard mask patterns 23 and the second hard mask patterns 25 are formed at the same level on a surface of the target layer 22.

In another embodiment of the present invention, the first hard mask patterns 23 may be formed after the second hard mask patterns 25 are formed.

Figure 2E:
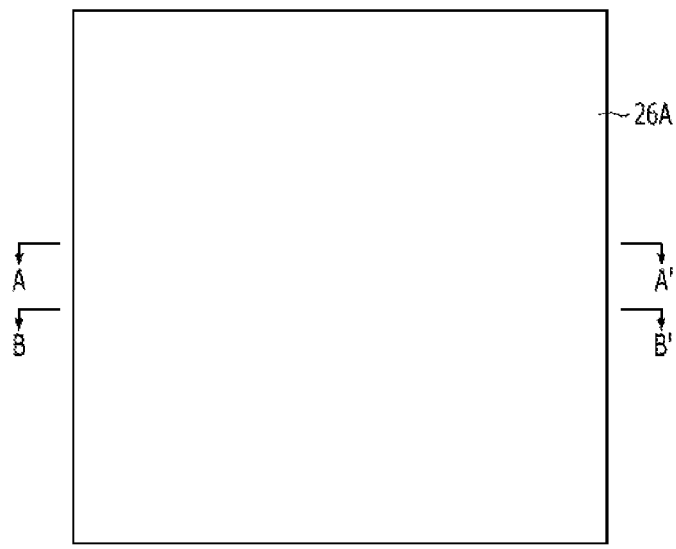
Figure 3E:
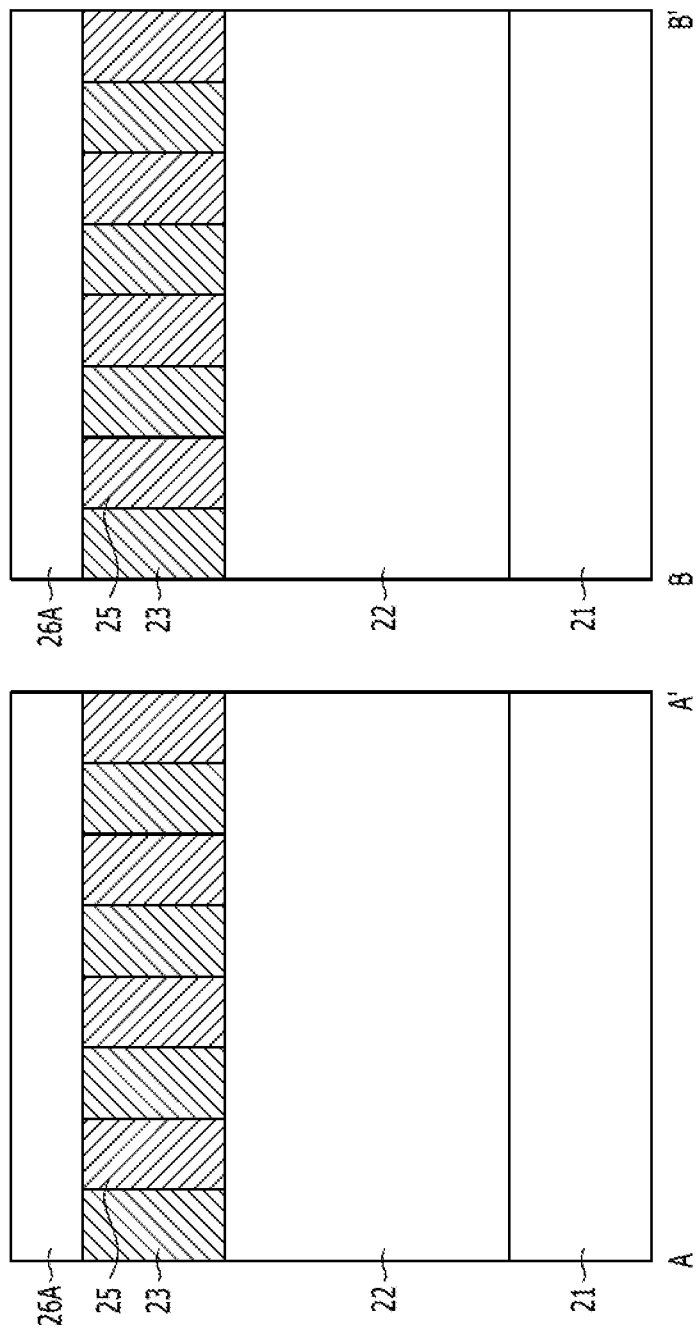

As shown in FIGS. 2E and 3E, the first sacrificial hard mask layer 26A is formed on the first hard mask patterns 23 and the second hard mask patterns 25. The first sacrificial hard mask layer 26A may be formed of a material having a different selectivity according to a material of the second hard mask patterns 25. The first hard mask patterns 23 and the first sacrificial hard mask layer 26A may include the same material. In an embodiment, the first sacrificial hard mask layer 26A may include a silicon oxide.

Figure 2F:
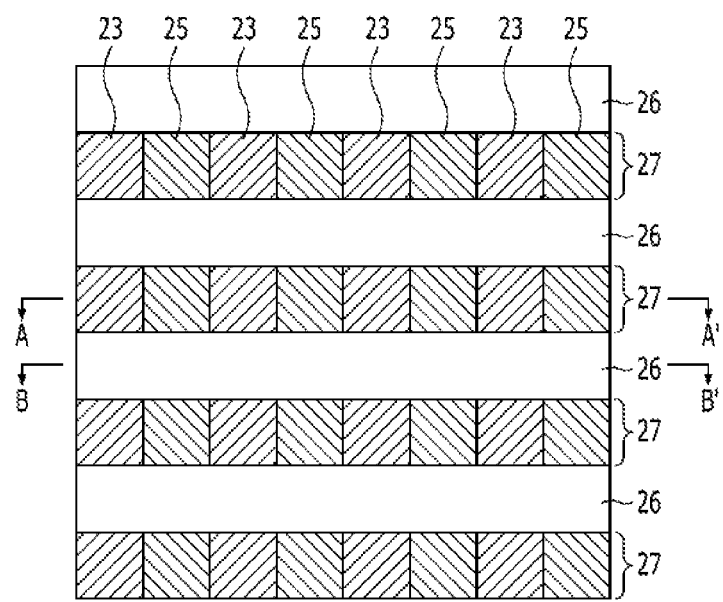
Figure 3F:
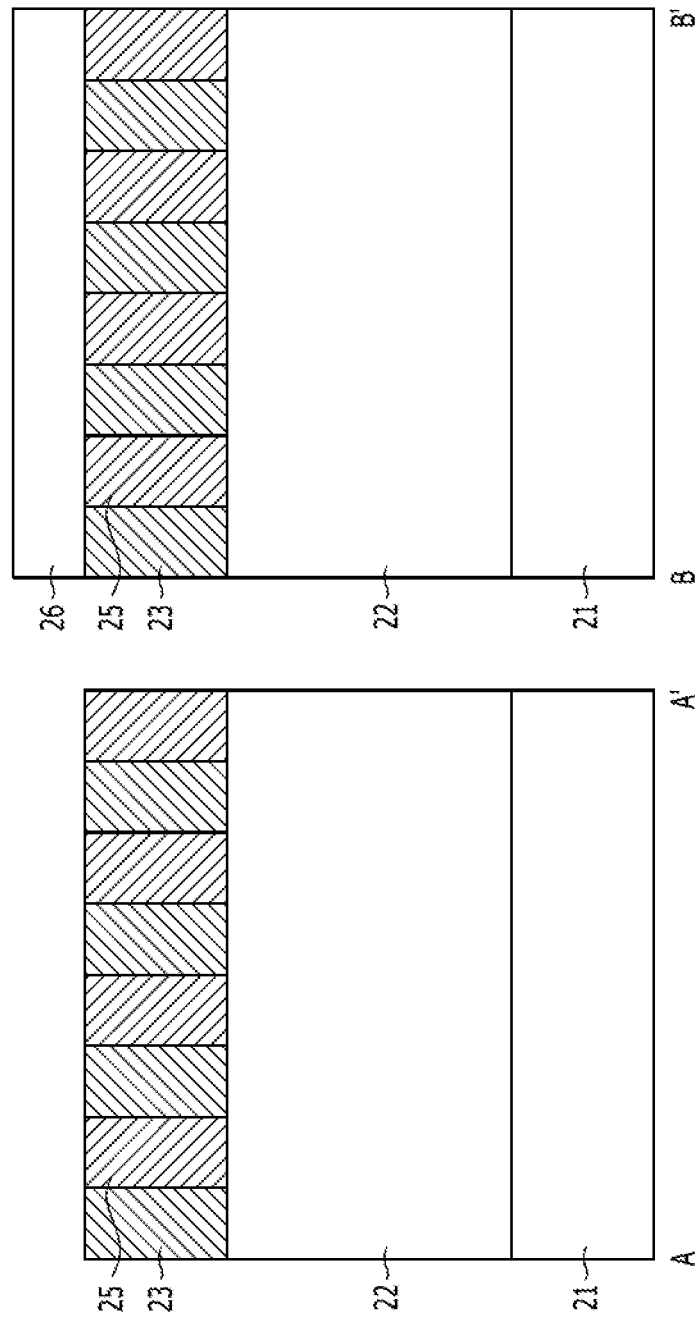

As shown in FIGS. 2F and 3F, first sacrificial hard mask patterns 26 may be formed by etching the first sacrificial hard mask layer 26A. The first sacrificial hard mask patterns 26 include line type patterns extending in a second direction. That is, the first sacrificial hard mask patterns 26 are formed with a plurality of lines, and second spaces 27 are provided between the plurality of lines. In an embodiment, the second spaces 27 are trenches extending in the second direction. The first sacrificial hard mask patterns 26 also extend in the second direction, which crosses a direction of the first hard mask patterns 23 and the second hard mask patterns 25. In an embodiment, the first direction is perpendicular to the second direction. In another embodiment of the present invention, the first direction and the second direction may be diagonal.

By forming the first sacrificial hard mask patterns 26 in such a manner, portions of the first hard mask patterns 23 and the second hard mask patterns 25 are simultaneously exposed under the second spaces 27. Portions of the first hard mask patterns 23 and the second hard mask patterns 25 are covered by the first sacrificial hard mask patterns 26.

The first sacrificial hard mask patterns 26 may be formed by a single patterning process. For example, the first sacrificial hard mask patterns 26 may be formed by an etching process using a photoresist pattern. Thus, a line width of the first sacrificial hard mask patterns 26 may be larger than a line width of the first and second hard mask patterns 23 and 25. An interval between the subsequently formed plurality of first opening units and the plurality of second opening units may be selectively adjusted by adjusting the line width of the first sacrificial hard mask patterns 26.

Figure 2G:
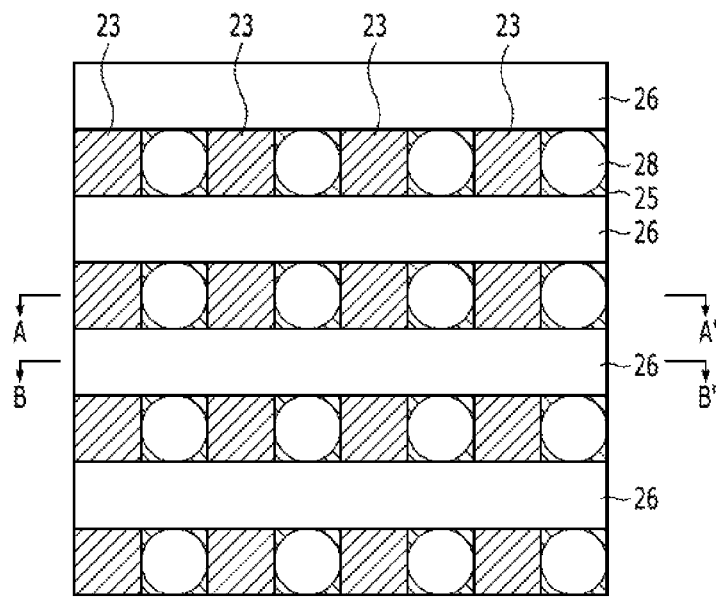
Figure 3G:
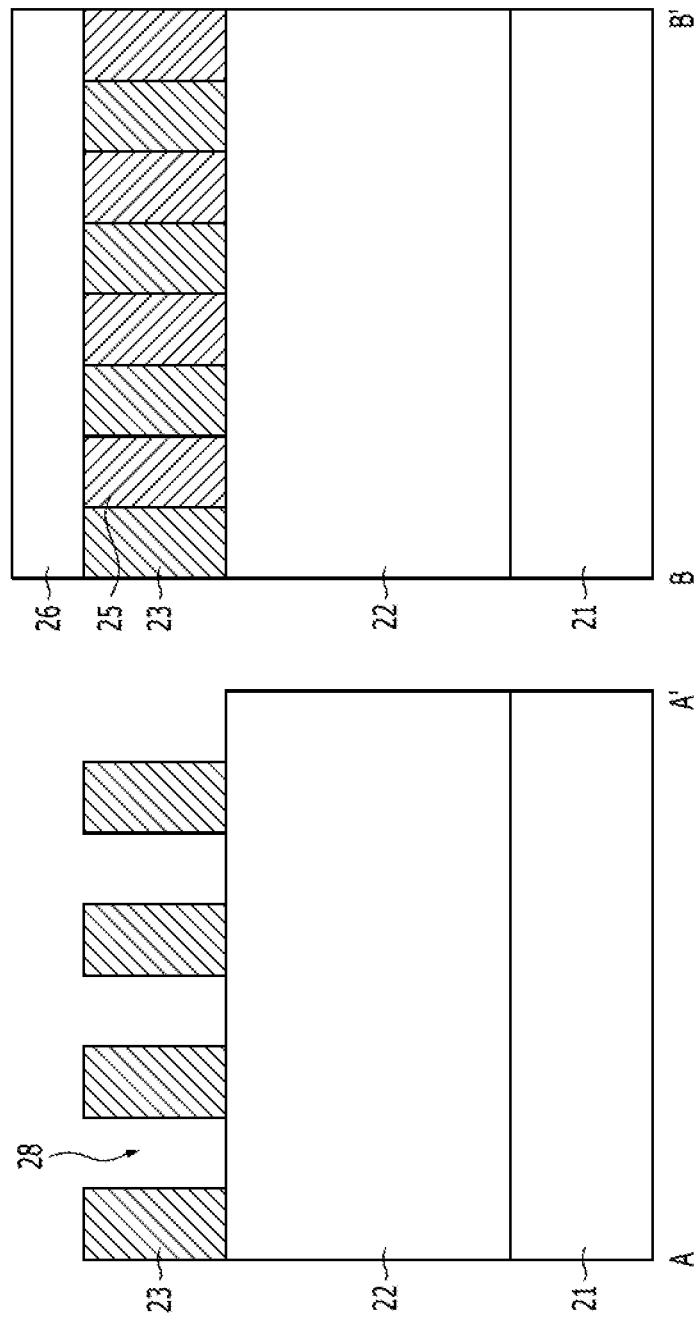

As shown in FIGS. 2G and 3G, the second hard mask patterns 25 are selectively etched. Herein, the first hard mask patterns 23 and the first sacrificial hard mask patterns 26 are used as a mask. The plurality of first opening units 28 are formed by etching the second hard mask patterns 25. The plurality of first opening units 28 are formed in the second hard mask patterns 25. Furthermore, the plurality of first opening units 28 are formed between the first hard mask patterns 23. Portions of the second hard mask patterns 25 remain under the first sacrificial hard mask patterns 26 after the etching process.

The plurality of first opening units may be formed as holes. In an embodiment, the plurality of first opening units 28 may have a sloped profile as an etch profile. A sidewall of the plurality of first opening units 28 may be formed to have a slope when the second hard mask patterns 25 are etched, such that sidewalls of the first opening units 28 are tapered. In an embodiment, the plurality of first opening units 28 are formed by performing a dry etching operation using a plasma.

Figure 2H:
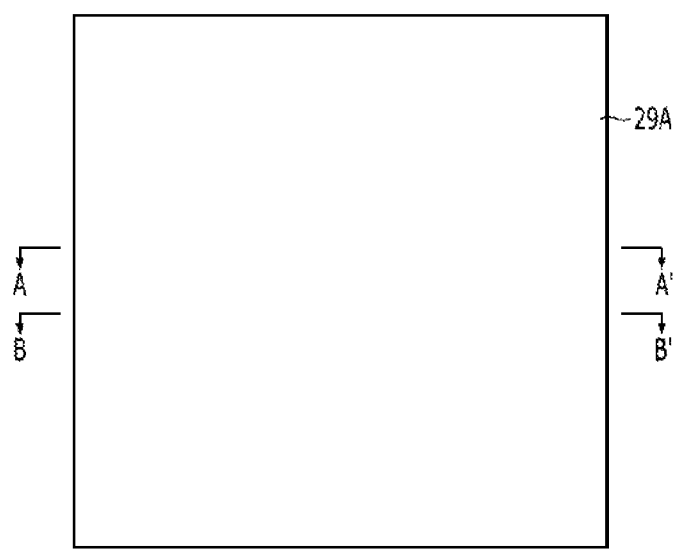

Referring to FIGS. 2H and 3H, the second sacrificial hard mask layer 29A, which fills the plurality of first opening units 28, is formed. The second sacrificial hard mask layer 29A may include a carbon-containing material. The second sacrificial hard mask layer 29A may include a carbon layer. The second sacrificial hard mask layer 29A may be formed to fill the plurality of first opening units 28 using a spin-on coating process.

Figure 2I:
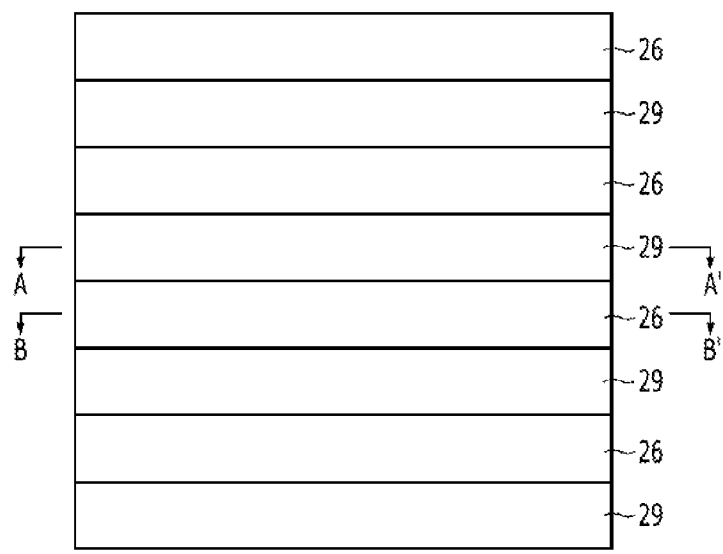
Figure 3I:
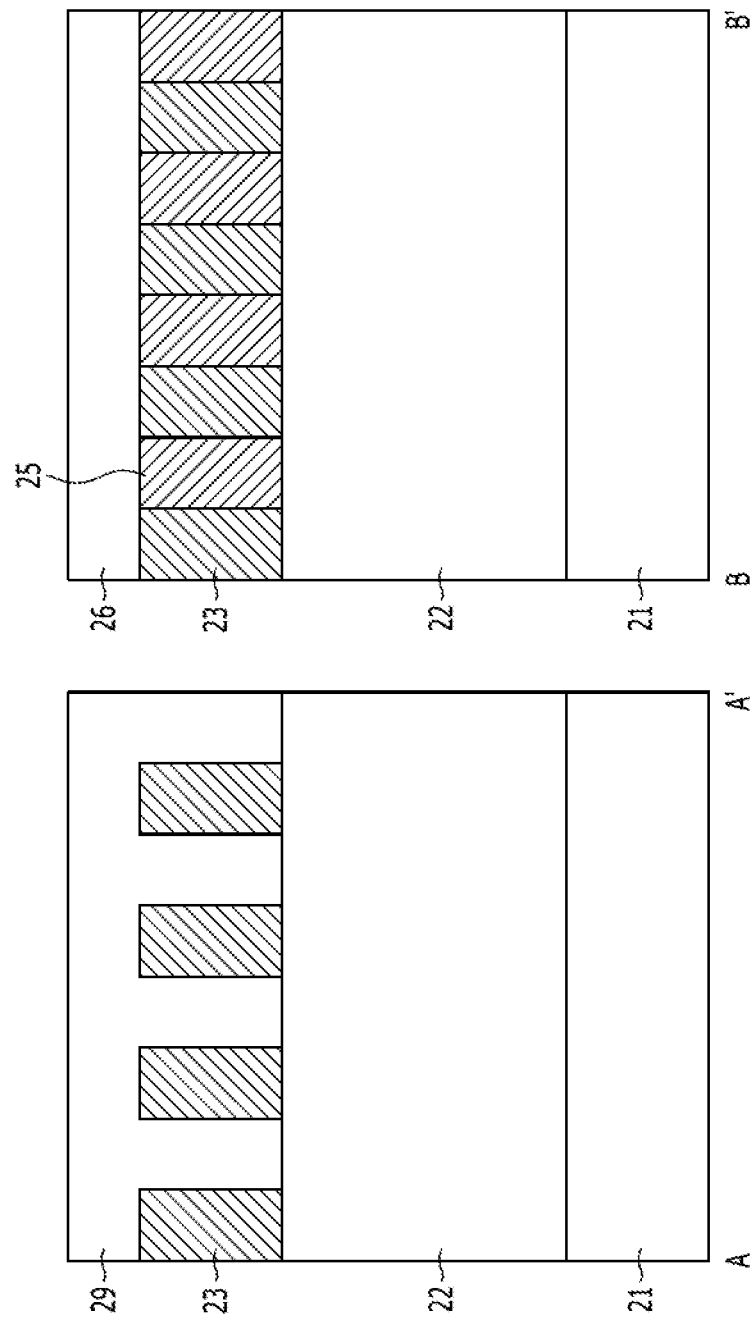

As shown in FIGS. 2I and 3I, second sacrificial hard mask patterns 29 are formed by planarizing the second sacrificial hard mask layer 29A. A planarization of the second sacrificial hard mask layer 29A may be performed until a surface of the first sacrificial hard mask patterns 26 is exposed. Thus, the second sacrificial hard mask patterns 29 are formed between the first sacrificial hard mask patterns 26. The second sacrificial hard mask patterns 29 may have line type patterns extending in the second direction. That is, lines of the second sacrificial hard mask patterns 29 are formed to extend parallel to the first sacrificial hard mask patterns 26.

As described above, lines of the first sacrificial hard mask patterns 26 and lines of the second sacrificial hard mask patterns 29 are alternately formed in the first direction.

Figure 2J:
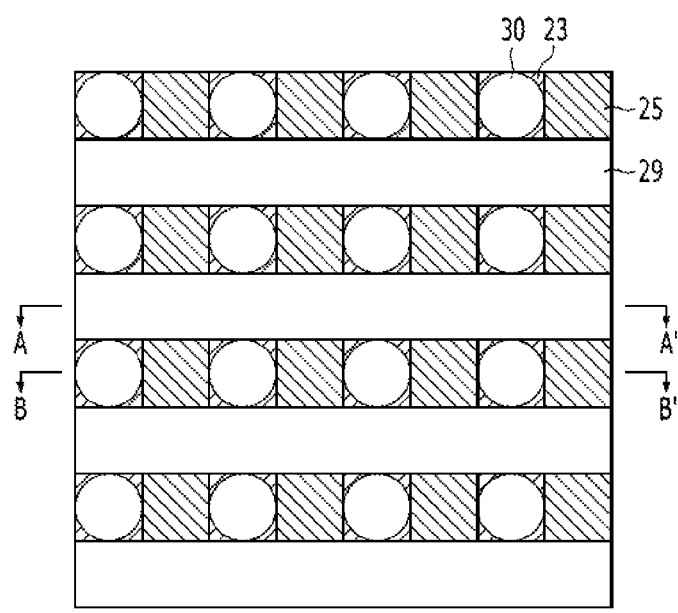
Figure 3J:
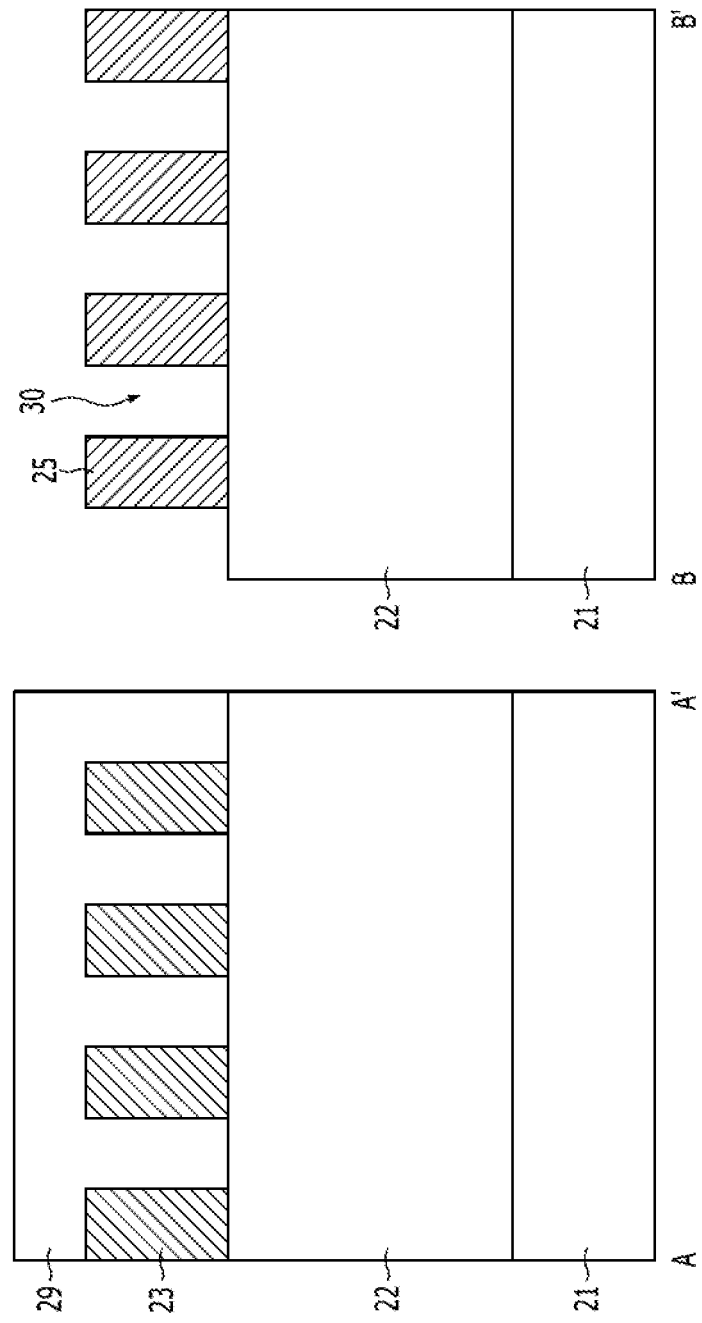

As shown in FIGS. 2J and 3J, the first sacrificial hard mask patterns 26 are removed. Thus, the first hard mask patterns 23 and the second hard mask patterns 25 are partially exposed by the second sacrificial hard mask pattern 29.

Next, a plurality of second opening units 30 are formed by etching the first hard mask patterns 23 using the second sacrificial hard mask patterns 29 and the second hard mask patterns 25 as an etch mask. The plurality of second opening units 30 are formed in portions of the first hard mask patterns 23 between the second hard mask patterns 25.

Figure 2K:
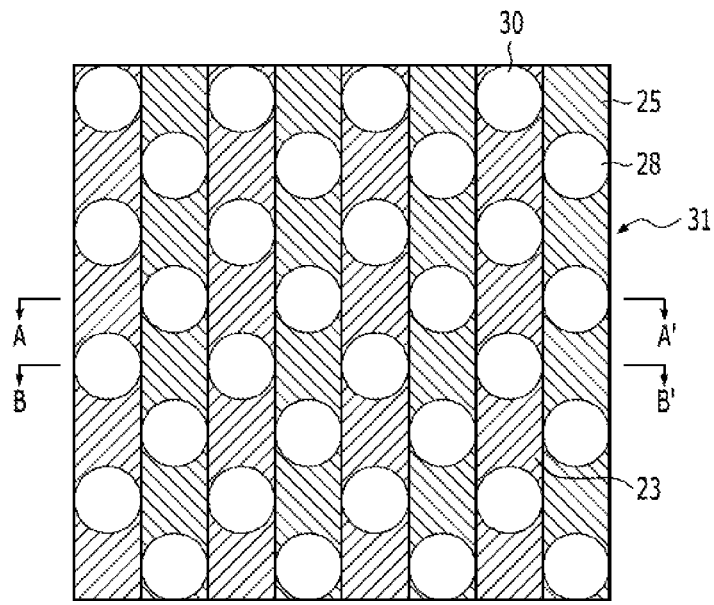
Figure 3K:
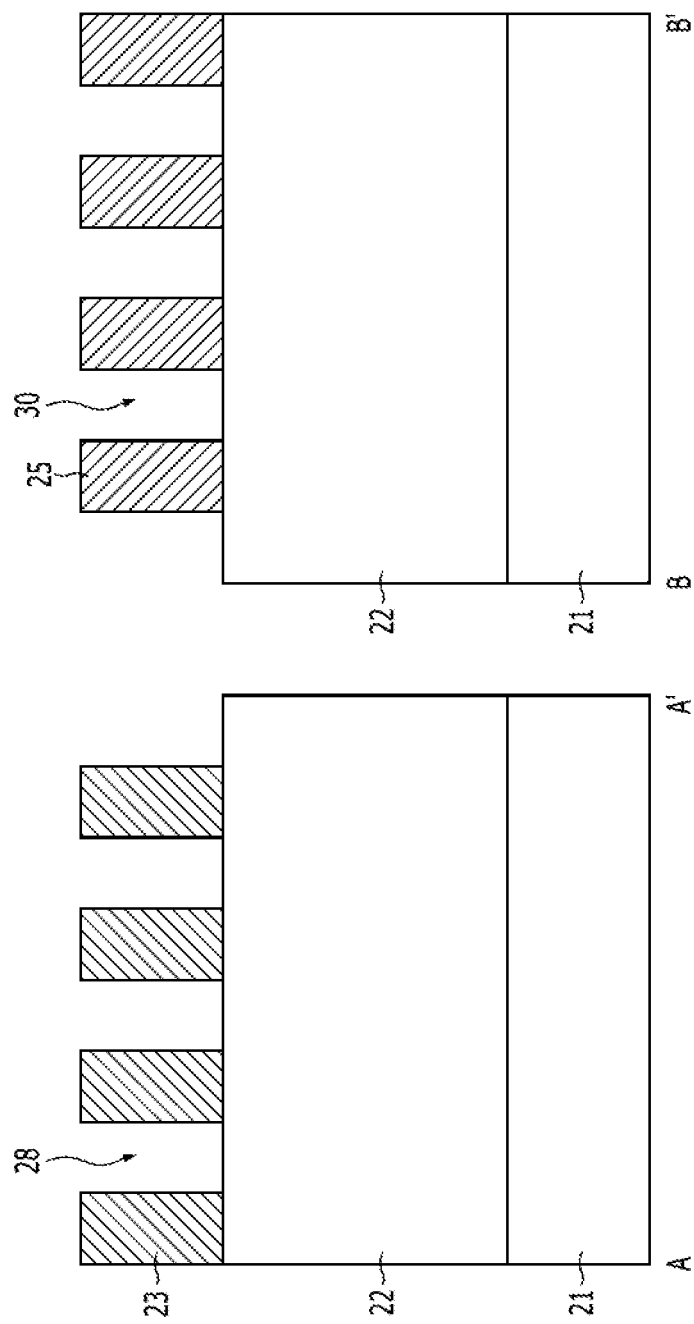

As shown in FIGS. 2K and 3K, the plurality of first opening units 28 are re-exposed by removing the second sacrificial hard mask patterns 29. The plurality of first opening units 28 and the plurality of second opening units 30 are arrayed in a pattern so that they are separated from each other.

Thus, a hybrid hard mask pattern 31 including the plurality of first opening units 28 and the plurality of second opening units 30 is formed. The hybrid hard mask pattern 31 includes the plurality of first hard mask patterns 23 and the plurality of second hard mask patterns 25. The plurality first hard mask patterns 23 and the plurality of second hard mask patterns 25 are adjacent to each other and extend in a predetermined direction. The plurality of first hard mask patterns 23 and the plurality of second hard mask patterns 25 are formed of line patterns extending in the same direction. The plurality of first opening units 28 are formed in the second hard mask patterns 25, and the plurality of second opening units 30 are formed in the first hard mask patterns 23.

As described above, the plurality of first opening units 28 and the plurality of second opening units 30 are formed in alternating line patterns with uniform line widths. Even when a structure for separating the first opening units 28 from the second opening units 30 is not formed, a bridge between the plurality of first opening units 28 and the plurality of second opening units 30 may be prevented using a method described above. Furthermore, even if spacing margins are not provided between line patterns of the first and second hard mask patterns, a bridge between neighboring opening units may be prevented.

Figure 2L:
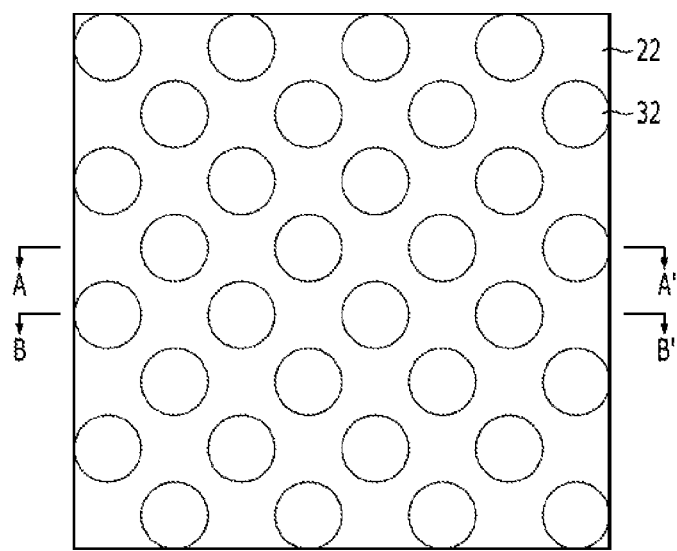
Figure 3L:
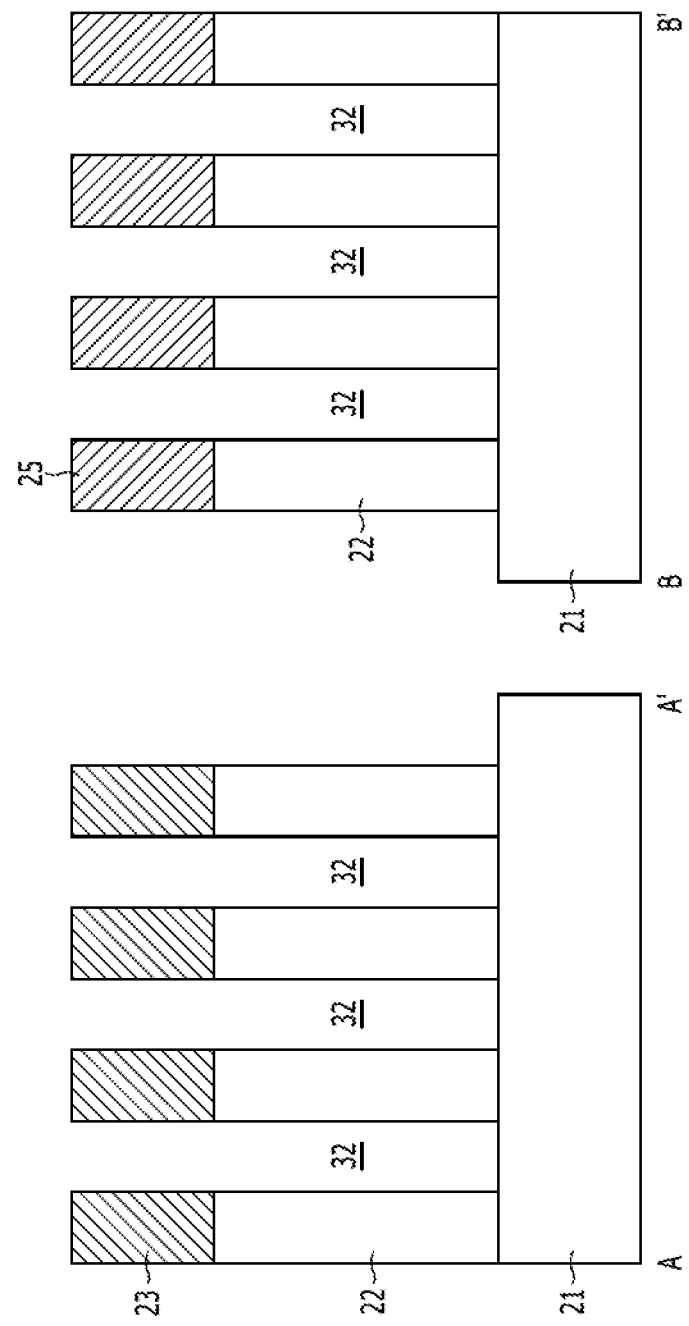

As shown in FIGS. 2L and 3L, a plurality of patterns 32 are formed in the target layer 22 by etching the target layer 22 using the hybrid hard mask pattern 31 as the mask. The plurality of patterns 32 are formed in the target layer 22 by transferring a pattern of the plurality of first opening units 28 and the plurality of second opening units 30. That is, the plurality of patterns 32 corresponding to the plurality of first opening units 28 and the plurality of second opening units 30 of the hybrid hard mask pattern 31 are formed in the target layer 22 by etching corresponding portions of the target layer 22. The plurality of patterns 32 may include a contact hole. The plurality of patterns 32 may include circle-shaped holes.

Figure 4:
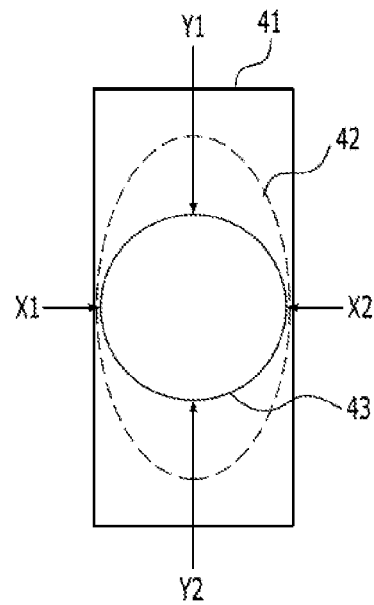
FIG. 4 illustrates a process of forming a pattern in accordance with an embodiment of the present invention.

FIG. 4 illustrates a process of forming a pattern in accordance with an embodiment of the present invention.

As shown in FIG. 4, a reticle may be used to form the pattern 43. A pre-pattern, which is defined in the reticle, may have a rectangular shape such a pre-pattern 41. An opening unit 42, which is formed by transferring the pre-pattern onto the semiconductor, may have an elliptical shape. Because etching is stronger in the Y-axis directions Y1 and Y2 than X-axis directions X1 and X2 and the rounded corner effect in photolithography, the rectangular pre-pattern results in an elliptical opening unit 42 in the hard mask pattern. Using the elliptical opening unit 42 to etch an underlying target layer results in a circular shaped pattern 43 being formed in the target layer.

Figure 5:
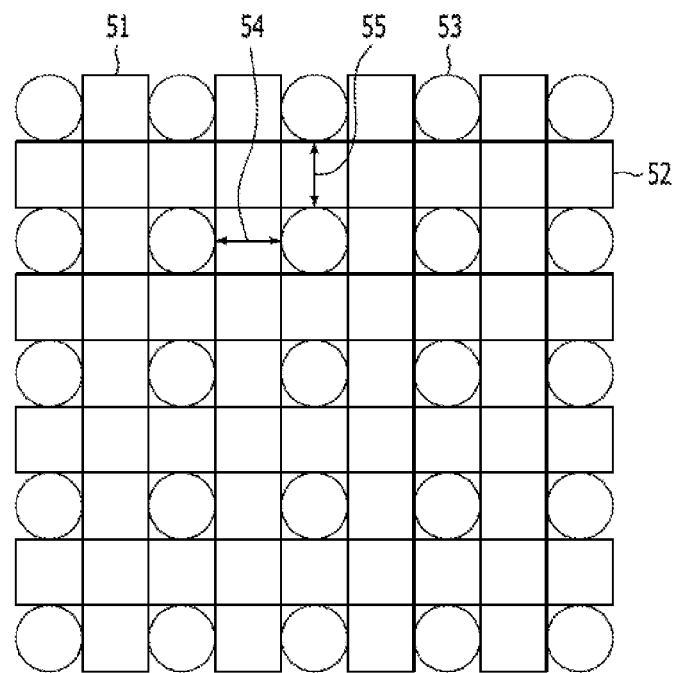
FIG. 5 is a diagram illustrating a pattern array in accordance with a comparative example.

FIG. 5 is a diagram illustrating a pattern array in accordance with a comparative example.

As shown in FIG. 5, a plurality of first line patterns 51 and a plurality of second line patterns 52 may be formed by a lithography-etching and lithograph-etching (LELE) process or a mesh type spacer patterning technology (SPT) process. The plurality of first line patterns 51 and the plurality of second line patterns 52 may be arranged as perpendicular lines that cross each other. A plurality of opening units 53 may be formed by etching a hard mask layer using the plurality of first line patterns 51 and the plurality of second line patterns 52. A target layer is etched using the hard mask pattern as an etch mask.

In the comparative example, the first line patterns 51 form an isolation structure between neighboring opening units 53 along a first direction, and the second line patterns 52 form an isolation structure between neighboring opening units 53 along a second direction. Thus, the degree of integration is limited since intervals 54 and 55 are disposed between the neighboring opening units 53.

Furthermore, in the comparative example, the opening units 53 may not have a uniform shape and the first and second line patterns 51 and 52 may not have a uniform line width.

Figure 6A:
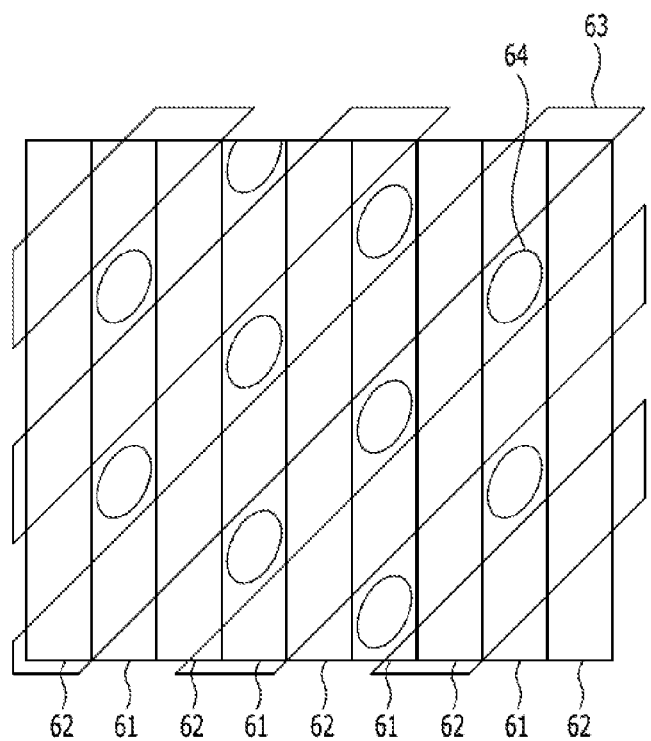
FIGS. 6A to 6C are diagrams illustrating a hard mask pattern array in accordance with another embodiment of the present invention.
Figure 6B:
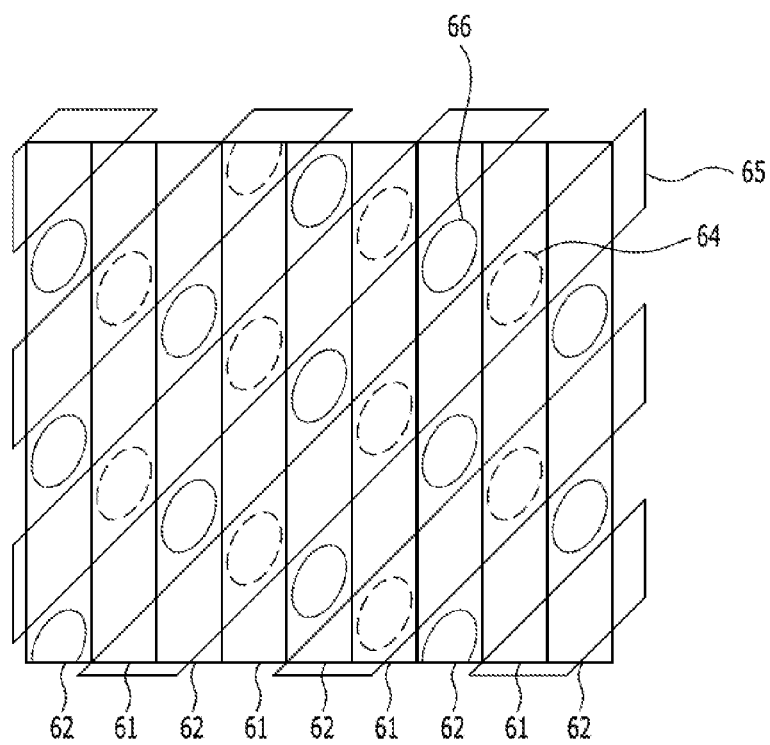
Figure 6C:
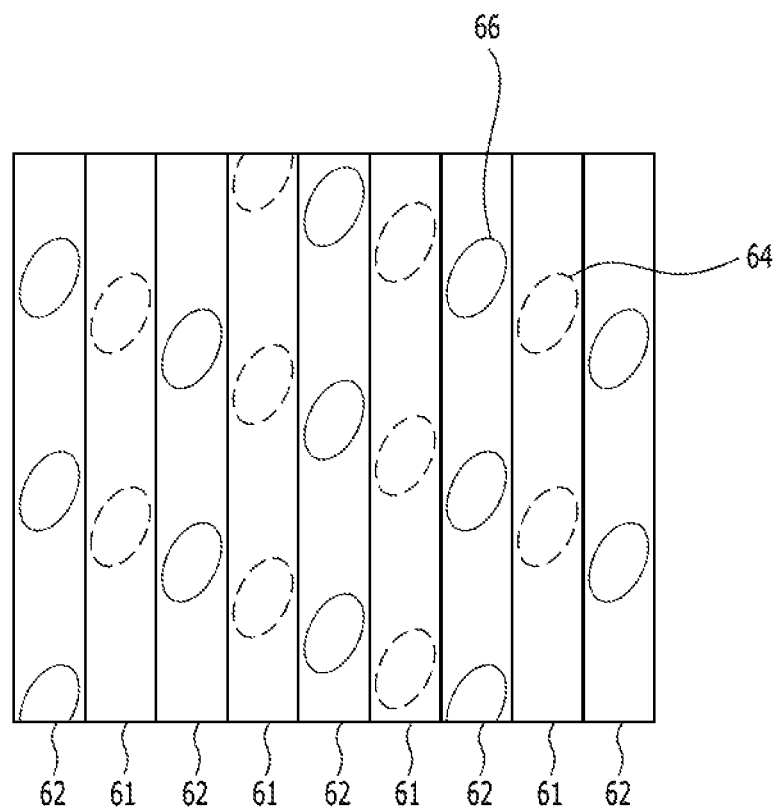

FIGS. 6A to 6C are diagrams illustrating a hard mask pattern array in accordance with an embodiment of the present invention.

As shown in FIGS. 6A to 6C, a plurality of first hard mask patterns 61 and a plurality of second hard mask patterns 62 are alternately formed in a direction along the X axis. Subsequently, a plurality of first sacrificial hard mask patterns 63 are formed at oblique angles across the plurality of first hard mask patterns 61 and the plurality of second hard mask patterns 62. A plurality of first opening units 64 having an elliptical shape may be formed in the plurality of first hard mask patterns 61.

Subsequently, a plurality of second sacrificial hard mask patterns 65 are formed at oblique angles across the plurality of first hard mask patterns 61 and the plurality of second hard mask patterns 62. A plurality of second opening units 66 having an elliptical shape may be formed in the plurality of second hard mask patterns 62.

Although the plurality of first opening units 64 and the plurality of second opening units 66 have an elliptical shape, the final shape of the patterns formed by etching the plurality of first opening units 64 and the plurality of second opening units 66 may be circle shaped, as described above with respect to FIG. 4.

Figure 7A:
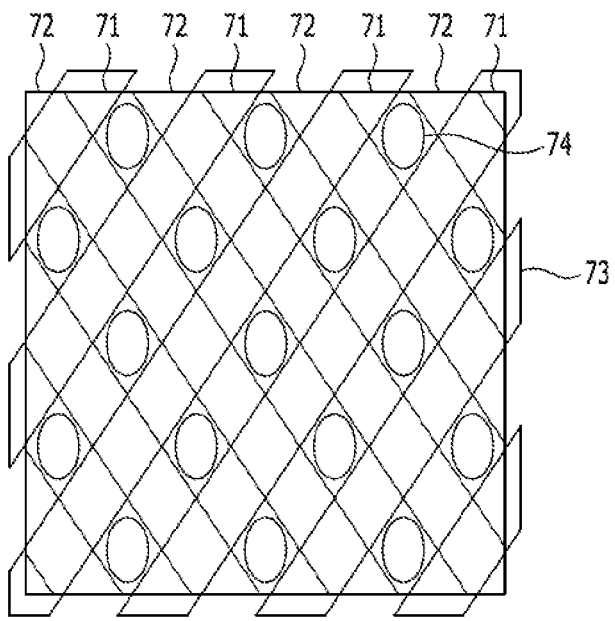
FIGS. 7A to 7C are diagrams illustrating a hard mask pattern array in accordance with another embodiment of the present invention.
Figure 7B:
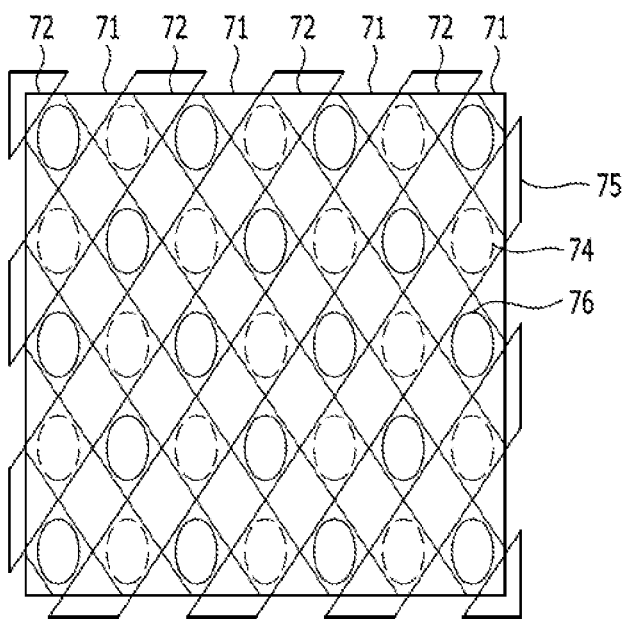
Figure 7C:
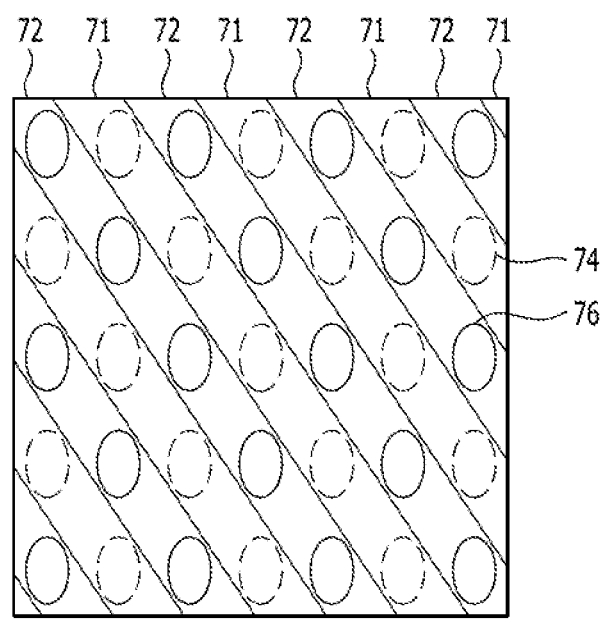

FIGS. 7A to 7C are diagrams illustrating a hard mask pattern array in accordance with another embodiment of the present invention.

As shown in FIGS. 7A to 7C, a plurality of first hard mask patterns 71 and a plurality of second hard mask patterns 72 are alternately formed. The plurality of first hard mask patterns 71 and the plurality of second hard mask patterns 72 may be formed at oblique angles with respect to a primary direction of a wafer, such as the X-axis of FIGS. 7A to 7C. Subsequently, a plurality of first sacrificial hard mask patterns 73 are formed. Herein, the plurality of first sacrificial hard mask patterns 73 are formed at oblique angles across the plurality of first hard mask patterns 71 and the plurality of second hard mask patterns 72. A plurality of opening units 74 having an elliptical shape may be formed on the plurality of first hard mask patterns 71.

Subsequently, the plurality of second sacrificial hard mask patterns 75 is formed at oblique angles with respect to first hard mask patterns 71 and the second hard mask patterns 72. Thus, a plurality of second opening units 76 having an elliptical shape may be formed on the plurality of second hard mask patterns 72.

In an embodiment in which the plurality of first opening units 74 and the plurality of second opening units 76 have an elliptical shape, the final shape of patterns formed by the plurality of first opening units 74 and the plurality of second opening units 76 may be a circle shape, as described above with respect to FIG. 4.

As described in aforementioned embodiments of the present invention, patterns, which are formed using a hybrid hard mask structure as an etch mask, may include a pattern having a high aspect ratio. A pattern according to an embodiment of the present invention may be implemented in a region where a storage node of a capacitor is to be formed. In addition, in an embodiment, the patterns may include a contact hole where a contact plug is formed, a region where a pillar structure is to be buried, and a trench where an isolation layer is to be buried to form an active region.

A semiconductor device in accordance with aforementioned embodiments of the present invention may be applied to a dynamic random access memory (DRAM). Furthermore, the semiconductor device may be further applied to a memory such as a static random access memory (SRAM), a flash memory, a ferroelectric random access memory (FeRAM), a magnetic random access memory (MRAM) and a phase change random access memory (PRAM).

Figure 8:
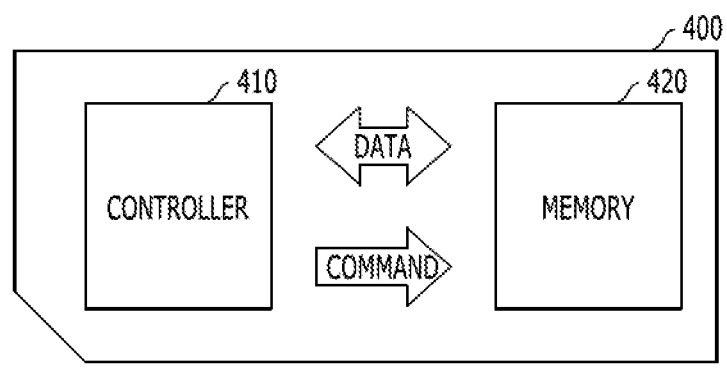
FIG. 8 is a block diagram illustrating a memory card according to an embodiment of the present invention.

FIG. 8 is a block diagram illustrating a memory card.

As shown in FIG. 8, a memory card 400 may include a controller 410 and a memory 420. The controller 410 and the memory 420 may exchange electrical signals. More specifically, the memory 420 and the controller 410 may exchange data in response to a command of the controller 410. Thus, the memory card 400 may store the data in the memory 420 or output the data from the memory 420 to an external device. The memory 420 may include a semiconductor device according to one or more of the embodiments described above. The memory card 400 may be used as a data storage medium for diverse portable devices. For example, the memory card 400 may include a memory stick card, a smart media card (SM), a secure digital card (SD), a mini secure digital card (mini SD) or a multi media card (MMC).

Figure 9:
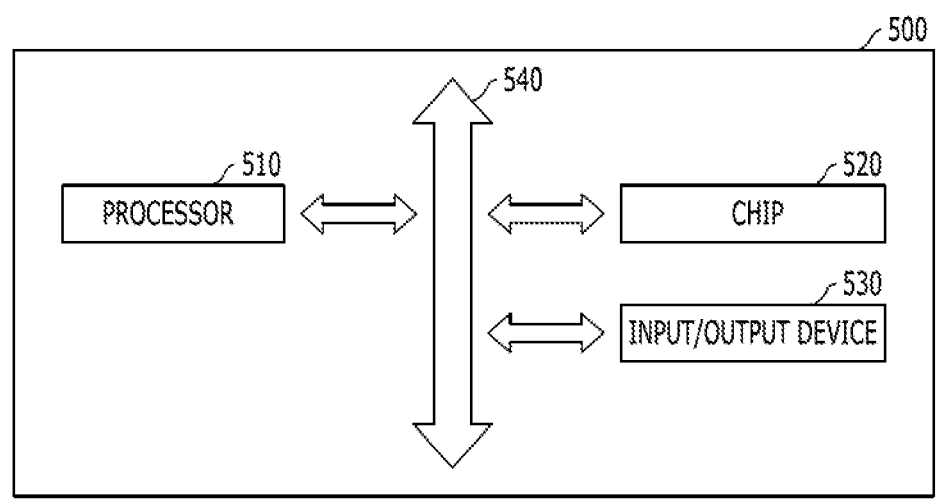
FIG. 9 is a block diagram illustrating an electronic system according to an embodiment of the present invention.

FIG. 9 is a block diagram illustrating an electronic system.

As shown in FIG. 9, the electronic system 500 may include a processor 510, an input/output device 530, and a chip 520 which performs data communication through a bus 540. The processor 510 executes instructions and controls the electronic system 500. The input/output device 530 may be used in inputting or outputting data to or from the electronic system 500. The electronic system 500 may be coupled to an external device, such as a personal computer or a network, and exchange data with the external device by using the input/output device 530. The chip 520 stores code and data for the operation of the processor 510 and performs an operation applied by the processor 510. The chip 520 may include a semiconductor device according to the embodiments described above. The electronic system 500 may include diverse electronic control devices having the chip 520. For example, the electronic system 500 may be used for mobile phones, MP3 players, navigators, solid-state disk (SSD), household appliances, and the like.

As described above, embodiments of the present invention may form a pattern having uniform line widths and uniform intervals without a bridge by forming an opening unit on each of a first hard mask pattern and a second hard mask pattern. In addition, embodiments of the present invention use an etching selectivity between hard mask patterns.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a plurality of first hard mask patterns separated by a plurality of trenches on a target layer;

forming a plurality of second hard mask patterns by filling the plurality of trenches;

forming a plurality of first opening units in the plurality of second hard mask patterns;

forming a plurality of second opening units in the plurality of first hard mask patterns; and forming a plurality of patterns corresponding to the plurality of first opening units and the plurality of second opening units by etching corresponding portions of the target layer, wherein forming the plurality of first opening units comprises:

forming a plurality of first sacrificial hard mask patterns extending in a direction that crosses a direction of the plurality of first and second hard mask patterns, the plurality of first sacrificial hard mask patterns being formed on the plurality of first and second hard mask patterns; and etching the plurality of second hard mask patterns using the plurality of first sacrificial hard mask patterns and the plurality of first hard mask patterns as a mask, wherein forming the plurality of second opening units comprises:

forming a plurality of second sacrificial hard mask patterns extending in the direction that crosses the direction of the plurality of first and second hard mask patterns and filling the plurality of first opening units; and etching the plurality of first sacrificial hard mask patterns and the plurality of first hard mask patterns using the plurality of second sacrificial mask patterns and the plurality of second hard mask patterns as a mask, and wherein a width of each of the plurality of first opening units is substantially equal to a width spacing apart the plurality of second opening units, and a width of each of the plurality of second opening units is substantially equal to a width spacing apart the first opening units.

2. The method of claim 1, wherein forming the plurality of first sacrificial mask patterns comprises:

forming a first sacrificial hard mask layer on the plurality of first and second hard mask patterns;

forming a mask pattern on the first sacrificial hard mask layer; and etching the first sacrificial hard mask layer using the mask pattern as an etch mask.

3. The method of claim 2, wherein the plurality of first sacrificial hard mask patterns are formed to have a line width larger than a line width of the plurality of first and second hard mask patterns.

4. The method of claim 1, wherein the plurality of first sacrificial hard mask patterns and the plurality of first hard mask patterns are formed of a same material.

5. The method of claim 4, wherein the plurality of first sacrificial hard mask patterns and the plurality of first hard mask patterns include silicon oxide.

6. The method of claim 1, wherein forming the plurality of second sacrificial hard mask patterns comprises:

forming a carbon layer including a carbon material on the plurality of first sacrificial hard mask patterns and exposed portions of the first hard mask patterns to fill the plurality of first opening units; and planarizing the carbon layer including the carbon material to expose a surface of the plurality of first sacrificial hard mask patterns.

7. The method of claim 1, wherein the plurality of first sacrificial hard mask patterns are formed of a carbon-containing material, and the plurality of second hard mask patterns are formed of a polysilicon material.

8. The method of claim 1, wherein the plurality of first opening units and the plurality of second opening units form an array of holes in a zigzag pattern.

9. The method of claim 1, further comprising, after forming the plurality of patterns:

removing the plurality of first and second hard mask patterns; and forming a storage node of a capacitor in each of the plurality of patterns.

10. The method of claim 1, wherein the plurality of first opening units and the plurality of second opening units are formed to have tapered profiles in which a width of each opening unit decreases towards a bottom of each opening unit.

11. A method for fabricating a semiconductor device, comprising:

forming a plurality of first hard mask patterns separated by a plurality of trenches on a target layer, the plurality of first hard mask patterns and the plurality of trenches extending in a first direction;

forming a plurality of second hard mask patterns filling the plurality of trenches;

forming a plurality of first sacrificial patterns extending in a second direction that crosses the first direction;

forming a plurality of first opening units by etching the plurality of second hard mask patterns using the plurality of first sacrificial patterns and the plurality of first hard mask patterns as an etch mask;

forming a plurality of second sacrificial patterns by filling the plurality of first opening units and filling spaces between each of the plurality of first sacrificial patterns;

forming a plurality of second opening units by etching the plurality of first hard mask patterns and the plurality of first sacrificial patterns using the plurality of second sacrificial patterns and the plurality of second hard mask patterns as an etch mask;

removing the plurality of second sacrificial patterns; and forming a plurality of hole patterns by etching the target layer under the plurality of first opening units and the plurality of second opening units, wherein a width of each of the plurality of first opening units is substantially equal to a width spacing apart the plurality of second opening units, and a width of each of the plurality of second opening units is substantially equal to a width spacing apart the first opening units.

12. The method of claim 11, wherein the plurality of first opening units and the plurality of second opening units form a hole array having a zigzag pattern.

13. The method of claim 11, wherein the plurality of first hard mask patterns include silicon oxide, and the plurality of second hard mask patterns include polysilicon.

14. The method of claim 11, wherein the plurality of first opening units and the plurality of second opening units are formed to have tapered profiles in which a width of each opening unit decreases towards a bottom of each opening unit.

15. A method for fabricating a semiconductor device, comprising:

forming a plurality of first hard mask patterns separated by a plurality of trenches on a target layer, the plurality of first hard mask patterns and the plurality of trenches extending in a first direction;

forming a plurality of second hard mask patterns filling the plurality of trenches;

forming a plurality of first sacrificial patterns extending in a second direction that crosses the first direction;

forming a plurality of first opening units by etching the plurality of second hard mask patterns using the plurality of first sacrificial patterns and the plurality of first hard mask patterns as an etch mask, the plurality of first opening units being spaced apart by a first interval in the first direction and being spaced apart by a second interval in the second direction;

forming a plurality of second sacrificial patterns by filling the plurality of first opening units and filling spaces between the plurality of first sacrificial patterns;

forming a plurality of second opening units by etching the plurality of first hard mask patterns and the plurality of first sacrificial patterns using the plurality of second sacrificial patterns and the plurality of second hard mask patterns as an etch mask, the plurality of second opening units being spaced apart by a third interval in the first direction and being spaced apart by a fourth interval in the second direction;

removing the plurality of second sacrificial patterns; and forming a plurality of hole patterns by etching the target layer under the plurality of first opening units and the plurality of second opening units, wherein a width of each of the plurality of first opening units is substantially equal to a width of the third interval and a width of the fourth interval, and a width of each of the plurality of second opening units is substantially equal to a width of the first interval and a width of the second interval.

16. The method of claim 15, wherein the plurality of first opening units and the plurality of second opening units are formed to have tapered profiles in which a width of each opening unit decreases towards a bottom of each opening unit.

\* \* \* \* \*